(12) United States Patent
Frutschy et al.

(10) Patent No.: US 7,209,026 B2
(45) Date of Patent: Apr. 24, 2007

(54) INTEGRATED PACKAGE INDUCTOR FOR INTEGRATED CIRCUIT DEVICES

(75) Inventors: Kristopher J. Frutschy, Phoenix, AZ (US); Udbhava A. Shrivastava, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/932,396

(22) Filed: Sep. 1, 2004

(65) Prior Publication Data

US 2006/0044101 A1 Mar. 2, 2006

(51) Int. Cl.
H01F 5/00 (2006.01)
(52) U.S. Cl. .................................................... 336/200
(58) Field of Classification Search .................. 336/65, 336/83, 200, 220–223, 232; 361/736–764; 257/531
See application file for complete search history.

(56) References Cited

U.S. PATENT DOCUMENTS

| 6,452,247 | B1 | 9/2002 | Gardner |
| 6,727,154 | B2 | 4/2004 | Gardner |
| 6,727,794 | B2* | 4/2004 | Busletta et al. ............. 336/200 |
| 2006/0152323 | A1* | 7/2006 | Pavier ........................ 336/200 |

FOREIGN PATENT DOCUMENTS

JP 2001-168930 * 6/2001

OTHER PUBLICATIONS

Chickamenahalli, S., H. Braunisch, J. He, S. Srinivasan, U. Shrivastava, & B. Sankman, "RF Packaging and Passives: Design, Fabrication, Measurement and Validation of Package Embedded Inductors", *IEEE Transactions on Advanced Packaging*, Nov. 2005, vol. 28, Issue 4, pp. 665-673.

Gikow, E., "Inductors and Transformers", *Electronics Engineers' Handbook*, 1982, no date.

Kramer, S.E., "Via Hole Plugging Processes", *Printed Circuit Design & Manufacture*, Mar. 2004, pp. 44-47, no date.

Lempkowski, R.B., and R.T. Croswell, "PWB-Embeddable Lateral Ferrite Core Inductor and Method of Forming Thereof", Oct. 2001, no date.

Polka, L., S. Chickamenahalli, C. Chung, D.G. Figueroa, Y. Li, K. Merley, D. Wood, & L. Zu, "Package-Level Interconnect Design for Optimum Electrical Performance", *Intel Technology Journal*, Q3 2000, pp. 1-17, no month.

"Single Package Radio for Handsets Applications", [online], [Retrieved on May 28, 2004], retrieved from the Internet at <URL: http://www.ece.uci.edu/rfmems/res-pckg.html>, 1.

Vardaman, E. Jan, "Are Embedded Passives Ready for Prime Time?", *Circuits Assembly*, Jul. 2003, pp. 12-13, no date.

Yoon, Y., E. Chen, M.G. Allen, & J. Laskar, "Embedded Solenoid Inductors for RF CMOS Power Amplifiers", *Proceedings of Solid-State and Actuators, Transducers '01 EurosensorsXV*, vol. 2, 2001, pp. 1114-1117, no month.

\* cited by examiner

*Primary Examiner*—Tuyen T. Nguyen
(74) *Attorney, Agent, or Firm*—Konrad Raynes & Victor LLP

(57) ABSTRACT

Provided are methods and devices in which an inductor is embedded in a package adapted to carry an integrated circuit and a magnetically permeable material is also embedded in the package so that the inductor and the magnetically permeable material are magnetically coupled to each other. In one embodiment, the magnetic permeable material is shaped as a pin which is press-fit into the core of a helix-shaped inductor embedded in the package substrate.

20 Claims, 6 Drawing Sheets

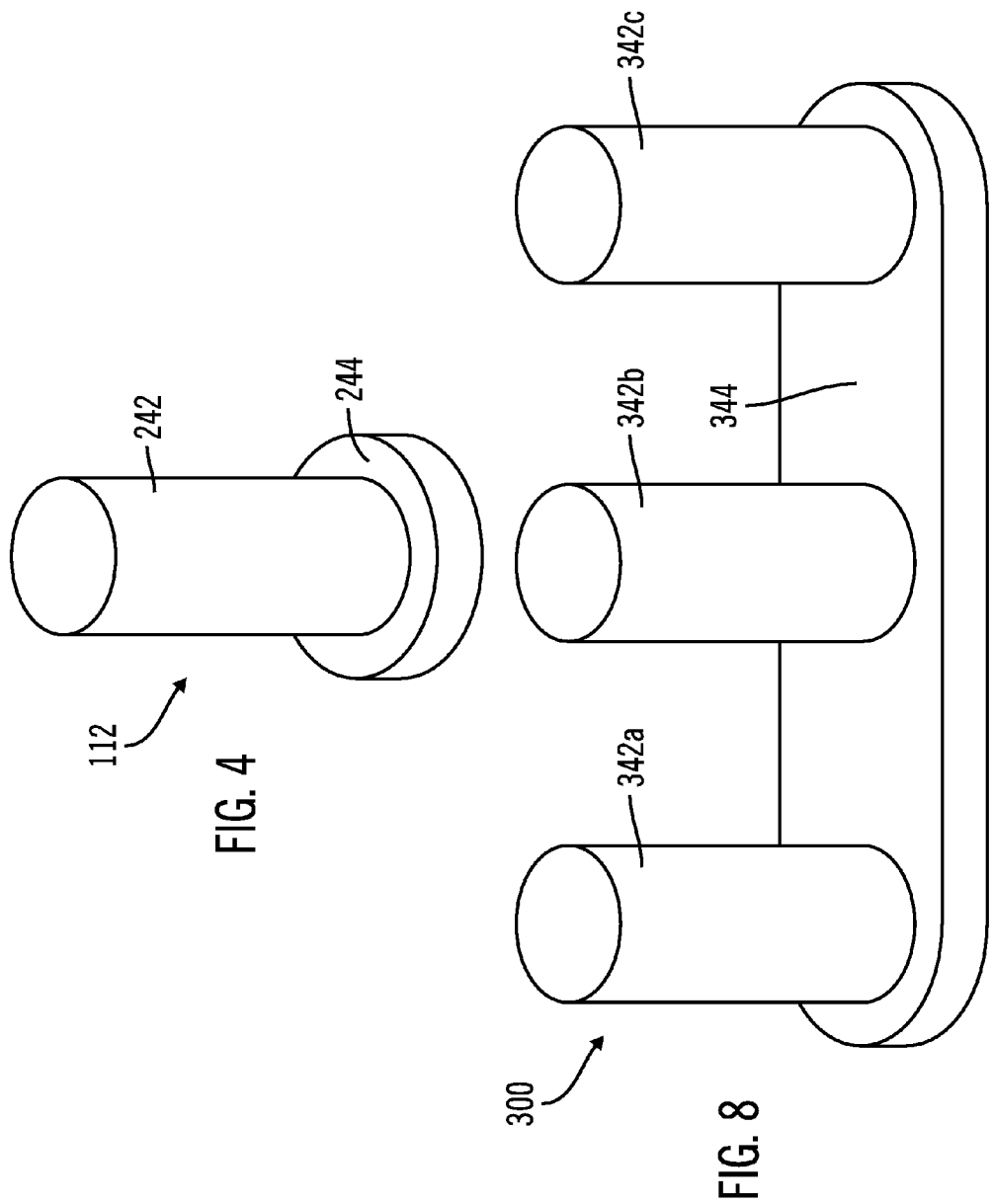

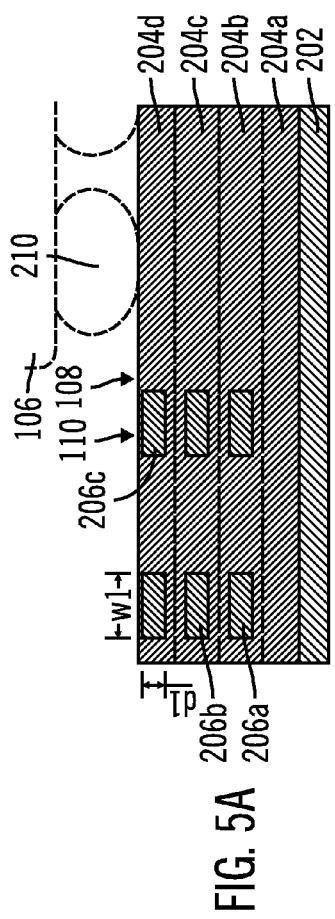
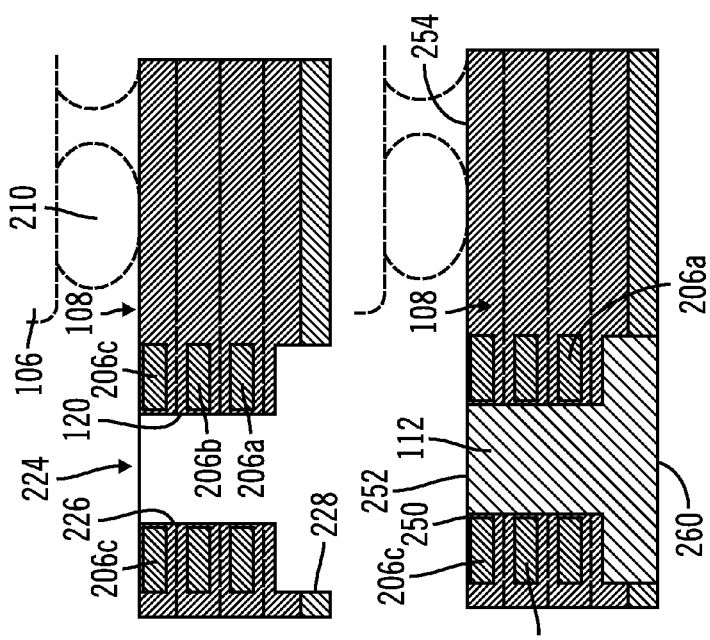
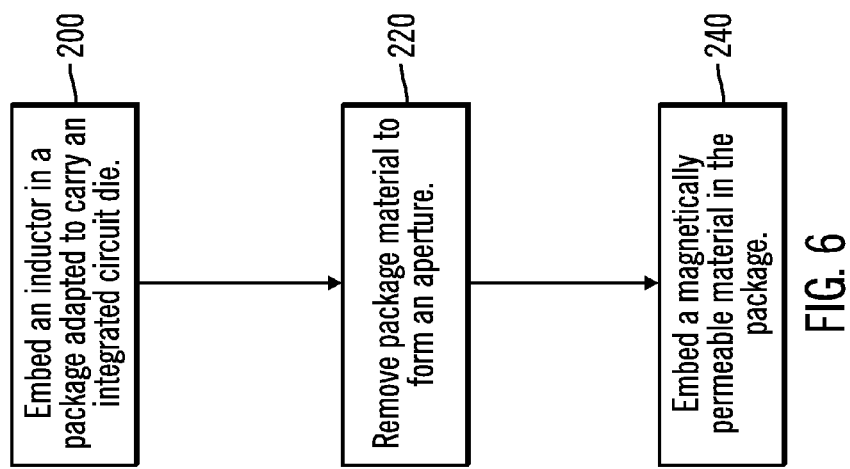
FIG. 5A
FIG. 5B
FIG. 5C
FIG. 6

INTEGRATED PACKAGE INDUCTOR FOR INTEGRATED CIRCUIT DEVICES

BACKGROUND

DESCRIPTION OF RELATED ART

Integrated circuits typically include various active and passive circuit elements which have been integrated into a piece of semiconductor material, often referred to as a die. The die may, in turn, be fully or partially encapsulated into a package, which often includes a ceramic or plastic substrate although other materials may be used. The package mechanically supports and protects the die which is often relatively fragile.

These packages are usually attached to a printed circuit board, often by pins, balls or other connectors arranged along the exterior of the package. The package may be attached directly to the printed circuit board, often by soldering or other connection techniques. In some applications, the package may not connect directly to the printed circuit board. Instead, an interposer or socket or other device may provide an intermediate connection between the package and the printed circuit board.

The connectors of the package typically provide separate electrical connection terminals between the printed circuit board (or interposer or socket), and the various inputs and outputs of the integrated circuit or circuits within the package. An integrated circuit die often has electrical connectors such as solder bumps to mechanically and electrically connect the integrated circuit die to the package substrate. In this manner, an electronic system can be formed by connecting various integrated circuit packages to a printed circuit board.

Inductors are used in numerous microelectronic applications, such as high frequency circuits, amplifiers, circuits for reducing electromagnetic interference (EMI), power converters (including direct-current to direct-current, alternating-current to alternating-current, direct-current to alternating current, and alternating-current to direct-current converters) for the distribution of power to circuits, and clocking circuits. In addition, other applications include radio frequency (RF) circuits such as are used in a myriad of wireless devices like cellular telephones, wireless modems, and other types of communications equipment.

An inductor is a conductor which is shaped in a manner which can store energy in a magnetic field adjacent to the conductor. Various designs of inductors are known. Common shapes for inductors include spirals, helixes and serpentine shapes. Thus, an inductor typically has one or more "turns" which can concentrate the flux of the magnetic field induced by current flowing through each turn of the conductor in a central area defined by the inductor turns. This central area is typically referred to as the inductor core. The inductance of the inductor may often be increased by positioning magnetically permeable material such as iron, steel, or other ferrites within the inductor core or within other areas adjacent to the conductor and within the magnetic fields so that the inductor and the magnetically permeable material are magnetically coupled to each other. The inductance may also be increased by increasing the number of turns of the inductor.

In some applications, discrete inductors are attached directly to a printed circuit board. In other applications, inductors have been embedded into printed circuit boards or integrated into or onto the semiconductor substrate of an integrated circuit die.

In yet other applications, inductors have been embedded into the substrate of a package supporting and protecting an integrated circuit die. In package substrates having multiple built-up layers, a turn of an inductor may be embedded into each layer. For example, FIG. 1 illustrates a known multi-turn helix-shaped inductor 10 embedded in a package substrate 12 on which an integrated circuit die 14 is supported by solder bumps 16. Each turn 10a, 10b, 10c of the inductor 10 is embedded in a layer 18a, 18b, 18c, respectively of the substrate 12. The layers 18a, 18b, 18c are typically laid down in a stacked arrangement on a core layer 20. Inductors such as inductor 10 embedded in a semiconductor package substrate 12 may have an air or polymer filled core 22.

BRIEF DESCRIPTION OF THE DRAWINGS

Referring now to the drawings in which like reference numbers represent corresponding parts throughout:

FIG. 4 is a schematic isometric view of an insert member comprising a permeable magnetic core for an embedded inductor in accordance with one embodiment of the present disclosure;

FIGS. 5a–5c are schematic cross-sectional views of operations to form an embedded inductor and embedded magnetically permeable material in accordance with one embodiment of the present disclosure;

FIG. 6 illustrates one example of operations to form an embedded inductor and embedded magnetically permeable material in accordance with one embodiment of the present disclosure;

FIG. 8 is a schematic isometric view of an insert member comprising multiple permeable magnetic cores for embedded inductors in accordance with another embodiment of the present disclosure.

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

Figures 1, 3:
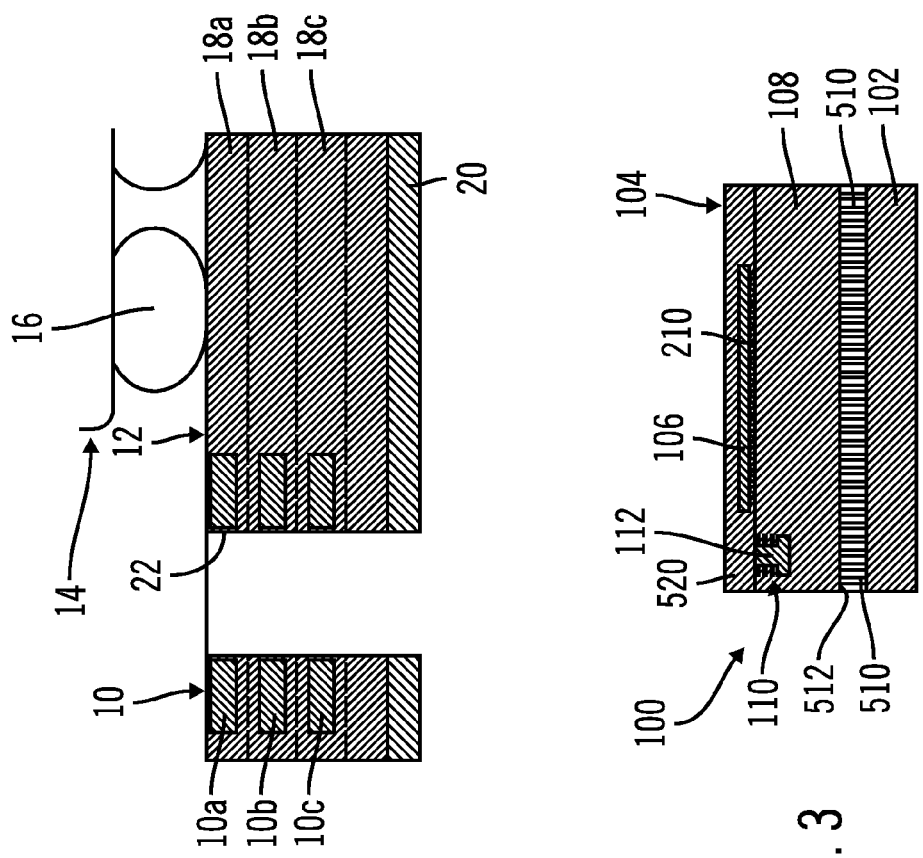
FIG. 1 schematically illustrates a prior art inductor embedded in a package for an integrated circuit die.
FIG. 3 is a schematic cross-sectional view of a package containing an integrated circuit die and an inductor in which the inductor and a magnetically permeable material are embedded in the package in accordance with one aspect of the present disclosure.
Figure 2:
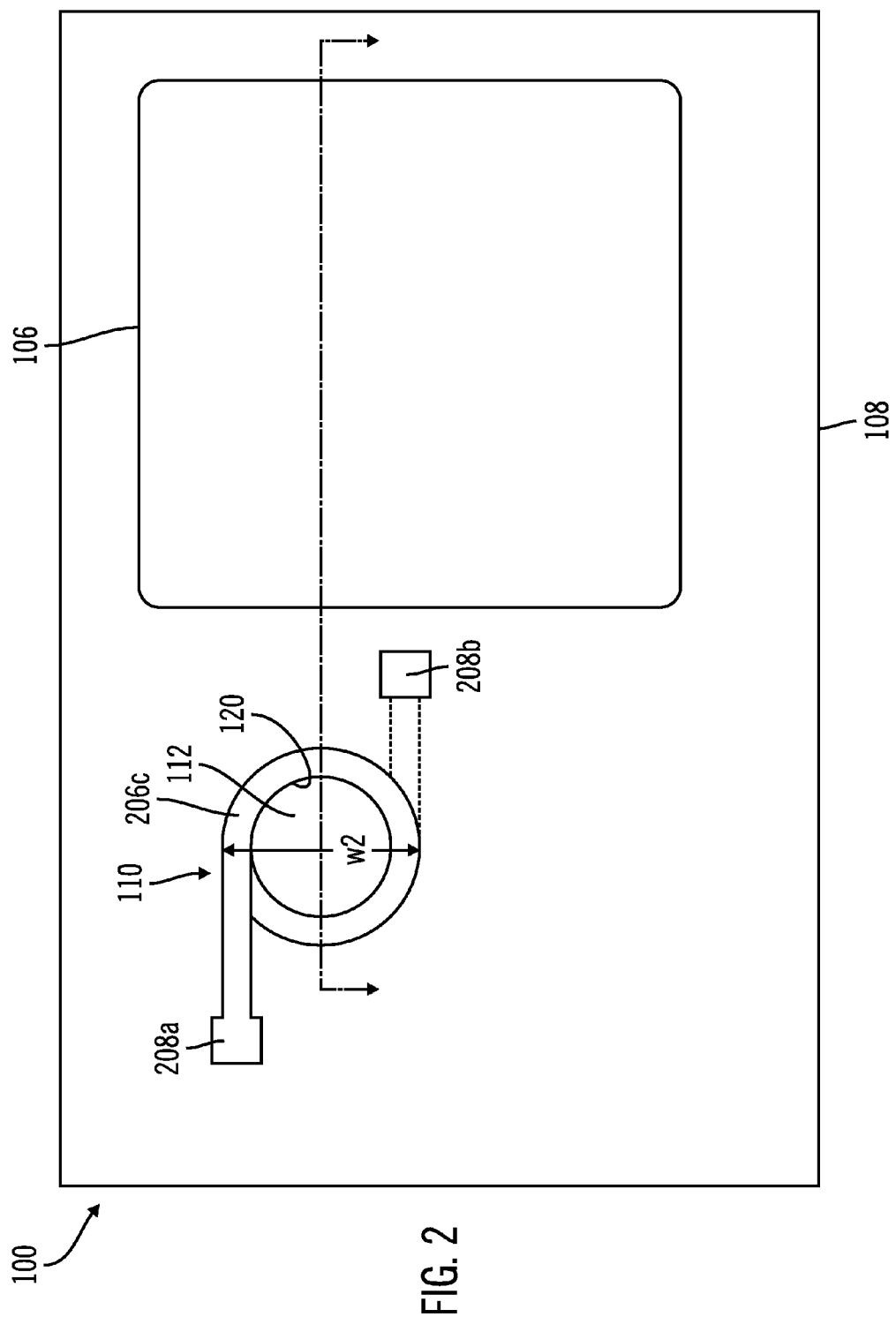
FIG. 2 is a top schematic view of a package containing an integrated circuit die and an inductor in which the inductor and a magnetically permeable material are embedded in the package in accordance with one aspect of the present disclosure.

FIGS. 2 and 3 illustrate an environment in which aspects of described embodiments may be employed. An electronic device 100 is electrically and mechanically coupled to a printed circuit board 102 (FIG. 3). The device 100 of this embodiment includes an integrated circuit package 104 which includes an integrated circuit die 106 disposed on a substrate 108 of the package 104, and an inductor 110 which is embedded in the substrate 108. As explained in greater detail below, the embedded inductor 110 has a plug 112 of magnetically permeable material embedded in the substrate 108 adjacent to the inductor 110. Such an arrangement can achieve relatively high inductance values for a given size, in a manufacturing process suitable for a variety of applications.

In the illustrated embodiment, the inductor 110 has a plurality of turns and is generally helix-shaped. It is appreciated that the number of turns of the inductor may vary, depending upon the particular application. For example, an inductor having 1–4 turns may be suitable for very high frequency applications in the gigahertz range. Other frequency ranges and numbers of turns may be utilized as well.

It is also appreciated that the inductor 110 may take a variety of different shapes. For example, the inductor 110 may have spiral or serpentine shape that is generally planar or is more fully three-dimensional, depending upon the particular application.

In the illustrated embodiment, the plug 112 of magnetically permeable material is generally pin-shaped, as shown in FIG. 4. As described in greater detail below, the plug 112 may be press fit into an aperture 120 (FIG. 2) of the package substrate 108 disposed in the core defined by the helix-shaped turns of the inductor 110. It is appreciated that the plug 112 may be formed in a variety of different shapes and assembled with the inductor 110 in a variety of different techniques, depending upon the particular application.

Also in the illustrated embodiment, the magnetically permeable material has a relatively high permeability such as a relative permeability in the range 5–100000, for example. In addition, the material may have resistivity in excess of 1,000 ohm-cm. Suitable magnetically permeable materials can be made by ferrites or coated powders of iron, nickel or cobalt and their alloys. It is appreciated that other materials having other permeability and resistivity values may be used as well.

FIGS. 5a–5c and 6 show an example of operations for embedding a magnetically permeable plug 112 in the core of an inductor 110 which is embedded (block 200) in a substrate 108 of an integrated circuit package 104 (FIG. 3). The inductor 110 may be embedded in an integrated circuit package substrate such as the substrate 108 in any of a variety of techniques known to those skilled in the art. In the illustrated embodiment, the substrate 108 comprises a multi layer structure of one or more insulative, dielectric materials. The substrate 108 includes a core layer 202 upon which successive layers 204a, 204b, 204c, 204d are laid down. After each layer is laid down, conductors may be formed before the next layer is laid down. Thus, for example, after layer 204b is laid down on layer 204a, a conductor 206a may be formed in layer 204b before layer 204c is laid down over layer 20b.

In the example of FIGS. 5a–5c, the conductor 206a forms a turn of the helix-shaped inductor 110. The conductor 206a may be formed in a variety of techniques known to those skilled in the art. For example, a trench may be etched in the layer 204b and an electrically conductive material such as copper, aluminum etc. may be deposited into the trench. The conductor 206a and the layer 204b are subsequently covered with the next dielectric layer, layer 204c. The conductors 206b and 206c, providing additional turns of the inductor 110, may be formed in a similar manner in the respective substrate layers 204c and 204d. One end of the turn of conductor 206c may be connected to a connection pad 208a (FIG. 2) on the surface of the substrate 108. Similarly, metal-plated vias or other conductors may be formed in the substrate 108 to interconnect the conductors 206a, 206b, 206c to form the inductor 110 and to connect one end of the turn of the conductor 206a to a pad 208b at the surface of the substrate 108.

The size and number of the conductors 206a, 206b and 206c can affect the inductance value of the inductor 110. In the illustrated embodiment, each conductor 206a, 206b and 206c has a width w1 (FIG. 5a) in the range of 10–100 microns and a depth d1 in the range of 10–500 microns. In addition, each turn formed by a conductor 206a, 206b and 206c has a width w2 (FIG. 2) in the range of 100–5000 microns. For many applications, the inductor 110 may have an inductance in the range of 1–1000 nH. It is appreciated that other sizes of conductors may be used to form an embedded inductor 110 having other inductance values.

In the illustrated embodiment, the package substrate 108 is a multilayer structure comprising a core layer 202 and a plurality of built-up layers represented by the layers 204a–204. It is appreciated that the substrate 108 may have more layers or fewer layers including as few as a single monolithic layer.

The package substrate core layer 202 is formed of a relatively stiff, insulative dielectric material such as BT polymer to provide mechanical support for the built-up layers 204a–204d as well as the integrated circuit die 106 once it is secured in the package 104. It is appreciated that for mechanical stiffness the core layer may be made of a variety of insulative or conductive materials including, metals, ceramics, and polymers. The built-up layers 204a–204d of the package substrate 108 may similarly be made of a variety of different insulating materials including plastics, ceramics and polymers.

In the illustrated embodiment, the integrated circuit die 106 is mechanically and electrically connected to the package substrate 108 by a plurality of solder bumps 210. It is appreciated that the integrated circuit die 106 may be attached to connectors in or on the substrate 108 by any of a variety of other electrical and mechanical connectors including wires, pins, and pads and may be bonded by a variety of bonding techniques including solder, diffusion bonding, adhesives, encapsulation and others. In some applications, it may be more convenient to attach the integrated circuit die 106 to the substrate 108 after the inductor 110 is embedded or after the magnetically permeable plug 112 is embedded in the substrate 108. In other applications, the assembly operations of the inductor 110, plug 112 and die 106 may proceed in other ordered sequences, depending upon the particular application. Once the package 104 is completed, the embedded inductor 110 with embedded plug 112 may be spaced as close to the integrated circuit die 106 on the substrate 108 as a distance within a range of 10–5000 microns in many applications. It is appreciated that the die to embedded inductor spacing may vary, depending upon the particular application.

In another operation, package material is removed (block 220) to form an aperture 120 (FIG. 5b) in the substrate 108. In the illustrated embodiment, the helix-shaped inductor 110 defines a cylindrically-shaped core 224 and the aperture 120 includes a similarly shaped portion 226 formed within the inductor core 224. In addition, a counter-sink portion 228 of the aperture 120 is formed below the inductor 110.

In the illustrated embodiment, the aperture 120 is formed by drilling into the substrate 108. It is appreciated that the aperture 120 may be formed by other techniques including etching and punching. Also, the layers 202, 204a–204d may be formed in a fashion in which voids are formed to provide an aperture such as the aperture 120 adjacent the inductor position.

In another operation, a magnetically permeable member such as the plug 112 is embedded (block 240) in the package substrate 108 as shown in FIG. 5c. In the illustrated embodiment, the plug 112 has a generally cylindrically-shaped barrel portion 242 (FIG. 4) which conforms generally to the size and shape of the aperture portion 226. Also, the plug 112 has a generally disk-shaped flange portion 244 which conforms generally to the size and shape of the counter-sink portion 228 of the aperture 120.

As previously mentioned, the plug 112 may be press-fit into the aperture 120 as shown in FIG. 5c. In this position, the plug barrel portion 242 is snugly received in the aperture portion 242 and the plug flange portion 244 is snugly received in the aperture counter-sink portion 228. It is appreciated that a magnetically permeable member such as the plug 120 may be embedded in a package such as the package substrate 108 using a variety of techniques including encapsulation and the use of adhesives.

In the illustrated embodiment, the plug 112 is coated with an insulative material such as a polymer to ensure that contact between the plug 112 and one or more of the inductor conductors 206a–206c does not short the turns of the inductor 110 together. Other techniques may be used as well including providing sufficient insulative substrate material positioned between the inductor 110 and the plug 112 as indicated at 250, for example, to electrically insulate the inductor 110 from the plug 112 yet provide sufficient magnetic coupling between the inductor 110 and the plug 112.

In the illustrated embodiment, plug 112 is fully embedded within the package substrate 108. In this example, the top surface 252 of the plug 112 does not project beyond the top surface 254 of the substrate 108. Similarly the bottom surface 260 of the plug 112 does not project beyond the bottom surface (not shown) of the substrate 108. Such an arrangement facilitates the performance of additional operations on the surface of the substrate 108 after the plug 112 is embedded including paste printing. It is appreciated that in other embodiments, the plug 112 or the inductor 110 or both may be partially embedded such that a portion extends beyond the surface of the substrate in which it is embedded.

Figure 7A:
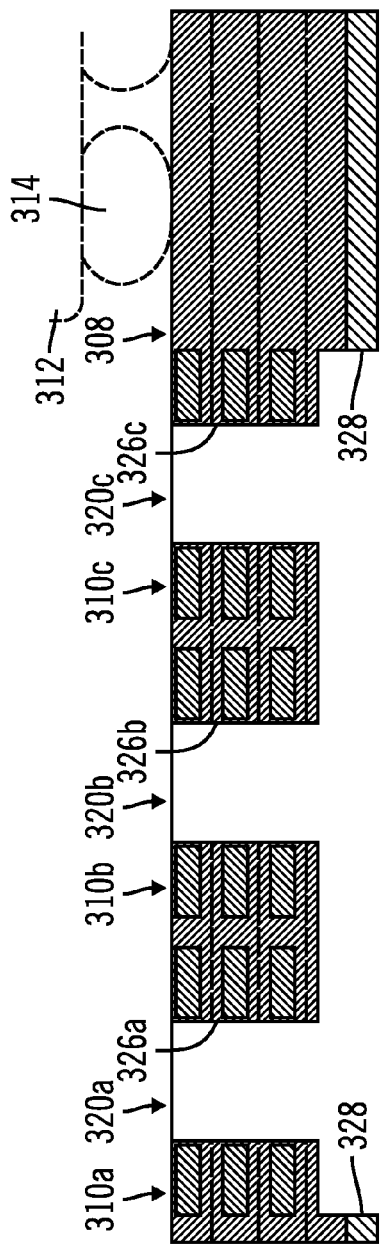
FIGS. 7a–7b are schematic cross-sectional views of operations to form an embedded inductor and embedded magnetically permeable material in accordance with another embodiment of the present disclosure.
Figure 7B:
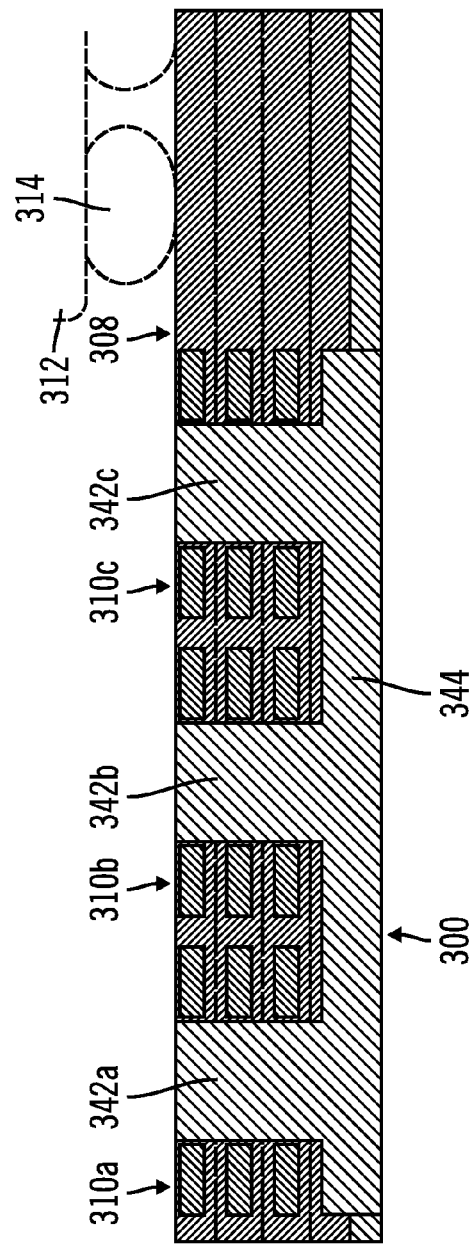

FIGS. 7a–7b show another example of operations for embedding a magnetically permeable plug 300 in a substrate 308 in which inductors 310a, 310b, 310c, are also embedded. Similar to the substrate 108, the substrate 308 is part of an integrated circuit package which when complete, includes an integrated circuit die 312 connected by solder bumps 314 to the package substrate 308. In the illustrated embodiment, the helix-shaped inductor 310a defines a cylindrically-shaped core 320a in which is formed a similarly shaped aperture portion 326a. Similarly, the helix-shaped inductor 310b, 310c each defines a cylindrically-shaped core 320b, 320c in which is formed a similarly shaped aperture portion 326b, 326c. A generally oval-shaped counter-sink aperture portion 328 is also formed below the inductors 310a, 310b, 310c and is connected to each of the aperture portions 326a, 326b, 326c.

In the illustrated embodiment, the aperture portions 326a, 326b, 326c, 328 are formed by drilling and milling into the substrate 308. Again, it is appreciated that these aperture portions may be formed by other techniques including etching and punching as described above.

In another operation, a magnetically permeable member such as the plug 300 (FIG. 8) is embedded in the package substrate 308 as shown in FIG. 7b. In the illustrated embodiment, the plug 300 has three generally cylindrically-shaped barrel portions 342a, 342b, 342c, each of which conforms generally to the size and shape of an associated aperture portion 326a, 326b, 326c. Also, the plug 300 has a generally oval-shaped flange portion 344 which conforms generally to the size and shape of the counter-sink aperture portion 328. The plug 328 may be press-fit into the substrate 308 as shown in FIG. 7c. In this position, the plug barrel portions 342a, 342b, 342c are each snugly received in the corresponding aperture portions 326a, 326b, 326c so that each inductor 310a, 310b, 310c is magnetically coupled to a magnetically permeable barrel-shaped portion 342a, 342b, 342c positioned within the associated inductor core 320a, 320b, 320c. In addition, the plug flange portion 344 is snugly received in the aperture counter-sink portion 328.

Figure 9A:
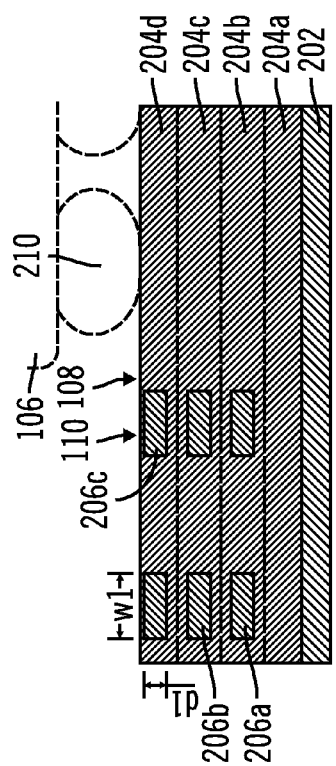
FIGS. 9a–9c are schematic cross-sectional views of operations to form an embedded inductor and embedded magnetically permeable material in accordance with yet another embodiment of the present disclosure.
Figure 9B:
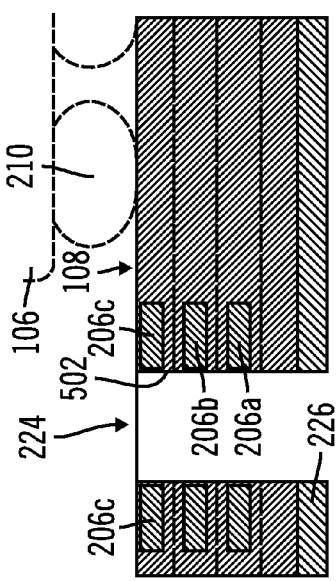
Figure 9C:
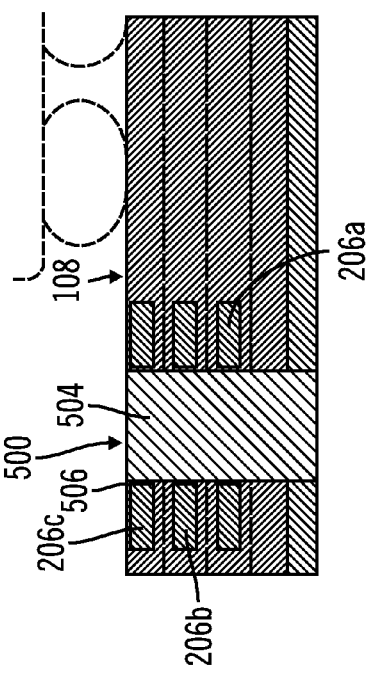

FIGS. 9a–9c show yet another example of operations for embedding a magnetically permeable plug 500 in the core 224 of an inductor 110 which is embedded (FIG. 9a) in a substrate 108 of an integrated circuit package similar to the inductor 110 of FIG. 5a and the package 104 of FIG. 3. Again, package material may be removed to form an aperture 502 (FIG. 9b) in the substrate 108. In the illustrated embodiment, the helix-shaped inductor 110 defines a cylindrically-shaped core 224 and the aperture 502 is similarly shaped within the inductor core 224.

In this embodiment, instead of inserting a preformed plug such as the insulation-coated, pin-shaped plug 112 of FIG. 5c, a paste comprising a magnetically permeable material 504 may be dispensed into the aperture 502 and then cured as needed. In one embodiment the material 504 may be dispensed by paste printing. It is appreciated that other dispensing techniques may be utilized. It is further appreciated that other magnetically permeable materials including liquids, gels and powders may be dispensed into the aperture 502 to provide magnetically permeable material adjacent to and magnetically coupled to the inductor 110.

In this embodiment, substrate material 506 is left within the inductor core 224 between the magnetically permeable material 504 and the conductors 206a, 206b, 206c of the inductor 110. Other techniques may be used as well to electrically insulate the inductor 110 from the plug 500 yet permit sufficient magnetic coupling between the inductor 110 and the plug 500.

The inputs and outputs of the electronic device 100 (FIG. 3) may be electrically connected to a printed circuit board 102 using connection terminals 510 which may include connection pins, solder bumps or other connection devices. In the illustrated embodiment, the connection terminals 510 depend from a bottom face 512 of the device 100. It is appreciated that the connection terminals 510 may extend from other faces of the device 100 as well.

As previously mentioned, the integrated circuit die 106 is mechanically and electrically connected by a plurality of solder bumps 210 to electrical conductors of the package substrate 108. Other electrical connectors including wires may be used in place of or in addition to the solder bumps 210. The package substrate 108 may have both internal and exterior conductors which are electrically connected to the solder bumps 210, connection pads 208a, 208b and connection terminals 510 to electrically interconnect the embedded inductor 110, the integrated circuit die 106 and the printed circuit board 102, as appropriate. The printed circuit board 102 may be a single layer or multi layered board which has a plurality of conductive lines that provide communication between the circuits in the device 100 and other components mounted to the board 102.

The integrated circuit die 106 may be encapsulated in a polymer such as an epoxy layer 520 depicted for the die 106. The integrated circuits of the die 106 may contain memory, logic or other elements as is known in the art.

The foregoing description of various embodiments has been presented for the purposes of illustration and explanation. It is not intended to be exhaustive or to limit to the precise form disclosed. Many modifications and variations are possible in light of the above teaching.

What is claimed is:

1. An electronic device for use with a printed circuit board, comprising:
    an integrated circuit die;
    a package having a substrate, said package being electrically connected to said die;
    an inductor embedded in said package substrate adjacent to said integrated circuit die and electrically coupled to said integrated circuit die, wherein said inductor comprises a plurality of turns which define a core inside said inductor; and
    a magnetically permeable member embedded within said inductor core so that said member is inside and magnetically coupled to said embedded inductor.

2. The device of claim 1 wherein said member has a magnetic permeability in excess of 5 and a resistivity in excess of 1000 ohm-cm.

3. The device of claim 1 wherein said package substrate includes a core layer and a plurality of layers built-up on said core layer and wherein said inductor includes a turn embedded in a substrate layer.

4. The device of claim 1 wherein said inductor has an inductance in a range of 1–1000 nH.

5. The device of claim 1 wherein said integrated circuit die is adapted to perform functions in wireless communication.

6. The device of claim 1 wherein said member comprises a dispensed and cured material.

7. The device of claim 1 wherein said inductor is spaced from said integrated circuit die by a distance in a range of 10–5000 microns.

8. The device of claim 1 wherein said member is pin-shaped having a barrel-shaped portion and a flange portion wider than said barrel portion.

9. The device of claim 1 wherein said package substrate has a plurality of stacked layers and said inductor has a plurality of turns, each turn being embedded in a package substrate layer.

10. The device of claim 1 wherein said substrate has a surface carrying said die and wherein said inductor and permeable member are fully embedded in said substrate so that said inductor and permeable member do not extend beyond said substrate surface.

11. An electronic device for use in a package having a substrate adapted to support an integrated circuit die positioned within said package, comprising:
    an inductor embedded in said package substrate and adapted to be electrically connected to said integrated circuit die, wherein said inductor comprises a plurality of turns which define a core inside said inductor; and
    a magnetically permeable member embedded within said inductor core so that said member is inside and magnetically coupled to said embedded inductor.

12. The device of claim 11 wherein said member has a magnetic permeability in excess of 5 and a resistivity in excess of 1000 ohm-cm.

13. The device of claim 11 wherein said package substrate includes a core layer and a plurality of layers built-up on said core layer and wherein said inductor includes a turn embedded in a substrate layer.

14. The device of claim 11 wherein said inductor has an inductance in a range of 1–1000 nH.

15. The device of claim 11 wherein said integrated circuit die is adapted to perform functions in wireless communication.

16. The device of claim 11 wherein said member comprises a dispensed and cured material.

17. The device of claim 11 wherein said inductor is shaped as a helix.

18. The device of claim 11 wherein said substrate defines a cylindrically-shaped aperture portion and a counter-sink shaped aperture portion and wherein said member is pin-shaped having a barrel-shaped portion received in said cylindrically-shaped aperture portion, and said pin-shaped member further has a flange portion wider than said member barrel portion and received in said counter-sink shaped aperture portion.

19. The device of claim 11 wherein said package substrate has a plurality of stacked layers and said inductor has a plurality of turns each turn being embedded in a package substrate layer.

20. The device of claim 11 wherein said substrate has a surface carrying said die and wherein said inductor and permeable member are fully embedded in said substrate so that said inductor and permeable member do not extend beyond said substrate surface.

* * * * *